(12) United States Patent
Fontana, Jr. et al.

(10) Patent No.: US 7,615,771 B2
(45) Date of Patent: Nov. 10, 2009

(54) MEMORY ARRAY HAVING MEMORY CELLS FORMED FROM METALLIC MATERIAL

(75) Inventors: Robert E. Fontana, Jr., San Jose, CA (US); Eric E. Fullerton, Morgan Hill, CA (US); Stefan Maat, San Jose, CA (US); Jan-Ulrich Thiele, Sunnyvale, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 0 days.

(21) Appl. No.: 11/380,498

(22) Filed: Apr. 27, 2006

(65) Prior Publication Data
US 2007/0253243 A1 Nov. 1, 2007

(51) Int. Cl.
*H01L 27/20* (2006.01)

(52) U.S. Cl. .................. 257/5; 257/2; 257/3; 257/4; 257/285; 257/295; 257/467; 257/529; 257/530; 257/E27.008; 257/E27.104

(58) Field of Classification Search .................. 257/529, 257/530, 467, 285, 3, 4, 295, 2, 5, E27.008, 257/E27.104
See application file for complete search history.

(56) References Cited

U.S. PATENT DOCUMENTS

| | | | |
|---|---|---|---|
| 3,607,460 A | 9/1971 | Lommel | |
| 4,225,946 A | 9/1980 | Neale et al. | |
| 5,440,233 A | 8/1995 | Hodgson et al. | |
| 6,387,476 B1 | 5/2002 | Iwasaki et al. | |
| 6,426,891 B1 | 7/2002 | Katori | |
| 6,545,287 B2 | 4/2003 | Chiang | |
| 6,653,704 B1 | 11/2003 | Gurney et al. | |
| 6,839,273 B2 | 1/2005 | Odagawa et al. | |
| 2004/0026730 A1* | 2/2004 | Kostylev et al. | 257/314 |
| 2004/0157417 A1* | 8/2004 | Moore et al. | 438/510 |
| 2004/0188735 A1 | 9/2004 | Hideki | |

(Continued)

FOREIGN PATENT DOCUMENTS

| | | |
|---|---|---|
| EP | 0864538 | 9/1998 |
| JP | 2003151182 | 5/2003 |

OTHER PUBLICATIONS

Kouvel, unusual nature of the abrupt magnetic transition in FeRh and its pseudobinary variants, J. Appl. Phys. 37, 1966, pp. 1257-1258.*

(Continued)

*Primary Examiner*—Kiesha L Rose
*Assistant Examiner*—Minchul Yang
(74) *Attorney, Agent, or Firm*—Duft Bornsen & Fishman, LLP

(57) ABSTRACT

Solid-state memories are disclosed that are comprised of cross-point memory arrays. The cross-point memory arrays include a first plurality of electrically conductive lines and a second plurality of electrically conductive lines that cross over the first plurality of electrically conductive lines. The memory arrays also include a plurality of memory cells located between the first and second conductive lines. The memory cells are formed from a metallic material, such as FeRh, having the characteristic of a first order phase transition due to a change in temperature. The first order phase transition causes a corresponding change in resistivity of the metallic material.

15 Claims, 3 Drawing Sheets

U.S. PATENT DOCUMENTS

2004/0232893 A1* 11/2004 Odagawa et al. ............ 320/154
2005/0281081 A1* 12/2005 Fullerton et al. ............ 365/173

OTHER PUBLICATIONS

Shinji, Yuasa et al., Change in the Resistivity of bcc and bct FeRh Alloys at First-Order Mangetic Phase Transitions, Journal of Physical Society of Japan, vol. 64, No. 10, Oct. 1998, pp. 3978-3985.

Aviram, A et al., Thermal Memory Technology, IBM Technical Disclosure Bulletin, Mar. 1985, pp. 6158-6163.

Broom, RF, Bistable Nonvolatile Memory Cell Using Vanadium Dioxide, IBM Technical Disclosure Bulletin, Apr. 1972, pp. 3551-3552.

Baranov, N. V., Barabanova, E.A., Electrical Resistivity and Magnetic Phase Transitions in Modified FeRh Compounds, Journal of Alloys and Compounds, vol. 219, Mar. 15, 1995, pp. 139-148.

* cited by examiner

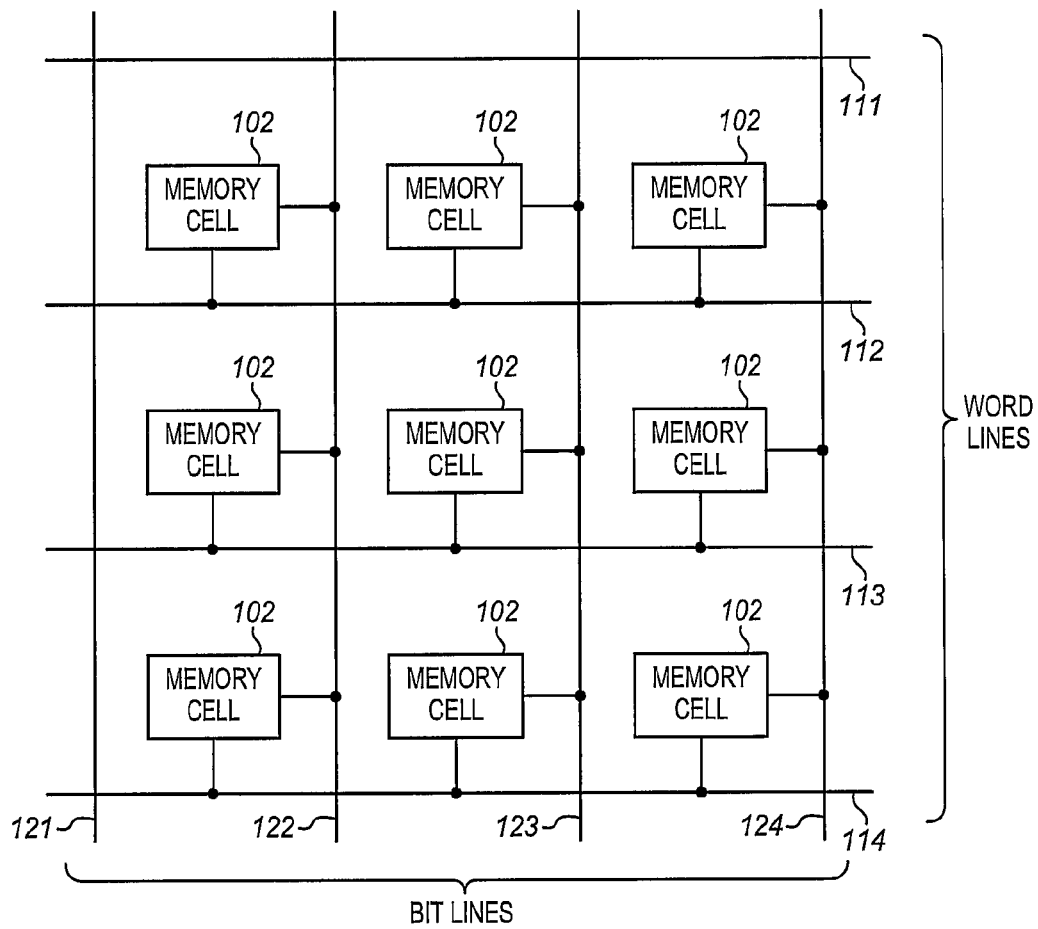
FIG. 1
FIG. 2
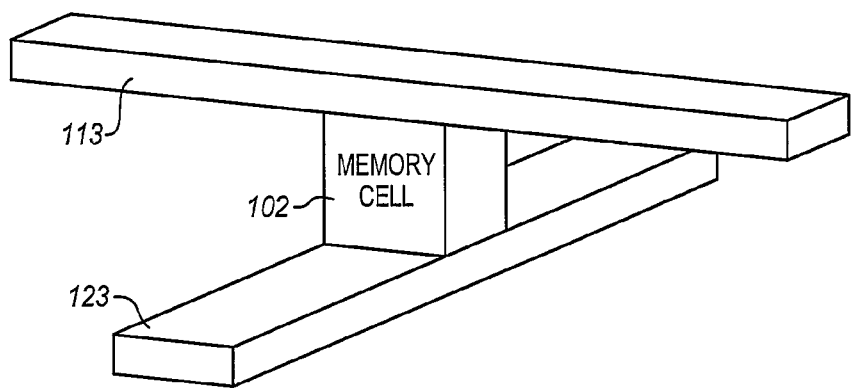

MEMORY ARRAY HAVING MEMORY CELLS FORMED FROM METALLIC MATERIAL

BACKGROUND OF THE INVENTION

1. Field of the Invention

The invention is related to the field of solid-state memories and, in particular, to memory arrays having memory cells formed from metallic material, such as a metallic alloy that includes Fe and Rh.

2. Statement of the Problem

Magnetic tunnel junction (MTJ) devices and other magnetic devices have been proposed as memory cells for use in cross-point memory arrays, such as a nonvolatile magnetic random access memory (MRAM) array. An MTJ device is comprised of two ferromagnetic layers separated by a thin insulating tunnel barrier layer and is based on the phenomenon of spin-polarized electron tunneling. The insulating tunnel barrier layer is thin enough that quantum mechanical tunneling occurs between the ferromagnetic layers. The tunneling phenomenon is electron-spin dependent, making the magnetic response of the MTJ device a function of the relative orientations and spin polarizations of the two ferromagnetic layers. Usually the tunneling probability of the charge carriers is highest when the magnetic moments of the ferromagnetic layers are parallel to one another. Thus, in MRAM the electrical resistance of an MTJ memory cell is in its lowest state when the magnetic moments or magnetizations of both ferromagnetic layers are parallel, and is in its highest state when the magnetic moments are antiparallel.

The electrical leads of the MRAM array are referred to as the bit line and the word line. For writing to a cell, current is passed down the bit and word lines. The sum of the magnetic fields that are generated by the current flowing down both lines is able to switch the magnetization of the free ferromagnetic layer in that cell. During the read process, sense current passes from the word line through the cell into the bit line. Depending on the relative orientation of the free and fixed ferromagnetic layers, the cell being read is in either a high or a low resistance state.

Other cross-point memory arrays use a mix of metallic layers and semiconductor layers to form the memory cells of the memory arrays. One problem with present MTJ MRAMs and other cross-point memory arrays using semiconductor materials in the memory cell is the generally high resistance-area product leading to increased resistance of the memory cell as its size is scaled down. Therefore the resistance of the present memory cells may be higher than desired. The high resistance reduces the speed of writing to the memory cells, which negatively affects the overall data rate of the memory array.

Moreover MTJ MRAM and similar cells are comprised of a plurality of metallic and insulating or semiconducting layers, making their fabrication and operation complex processes. For example in an MRAM cell it is required that the magnetic field from the writing current only reverses the free layer magnetization. Thus the fixed layer magnetization needs to be sufficiently pinned. This is typically achieved by exchange coupling the fixed layer to an antiferromagnet. Thus both the electrical and magnetic properties of every layer need to be accounted for.

SUMMARY OF THE SOLUTION

The invention solves the above and other related problems with an improved memory array that uses a metallic material exhibiting a first order phase transition with corresponding change in resistivity, such as in FeRh or a metallic alloy including Fe and Rh, for the memory cells as opposed to memory cells having metallic layers in conjunction with insulator or semiconductor layers. Purely metallic memory cells have a lower resistivity as compared with semiconductors, which improves the write time to the memory cells. Memory arrays using the metallic memory cells thus have a higher data rate over prior memory arrays. Also, if the memory cells are formed entirely from the metallic material, the memory cells may be formed in a single fabrication step, which simplifies fabrication.

One embodiment of the invention is a memory array that includes a plurality of word lines, a plurality of bit lines, and a plurality of memory cells located at the intersections of the word lines and the bit lines. The memory cells in this embodiment are formed from a metallic material having the characteristic of a temperature-induced first order phase transition from a first state to a second state also causing a corresponding change in resistivity. The transition from the first state to the second state may be broad in temperature, but should be substantially completed in a temperature range of less than about 20° C.

Another embodiment is a memory array that includes a first plurality of electrically conductive lines, a second plurality of electrically conductive lines that cross over the first plurality of electrically conductive lines at intersection regions, and a plurality of memory cells located at the intersection regions between the first plurality of electrically conductive lines and the second plurality of electrically conductive lines. The memory cells in this embodiment are formed from a metallic alloy including at least Fe and Rh.

Another embodiment is a memory array that includes a first plurality of electrically conductive lines, a second plurality of electrically conductive lines that cross over the first plurality of electrically conductive lines, and a plurality of memory cells between the first plurality of electrically conductive lines and the second plurality of electrically conductive lines. Each of the plurality of memory cells contacts one of the first plurality of electrically conductive lines and contacts one of the second plurality of electrically conductive lines. The memory cells in this embodiment are formed from a metallic material having the characteristic of a first order phase transition due to a temperature change causing a corresponding change in resistivity of the metallic material.

The invention may include other exemplary embodiments described below.

DESCRIPTION OF THE DRAWINGS

The same reference number represents the same element on all drawings.

FIG. 1 is a schematic diagram of a cross-point memory array in an exemplary embodiment of the invention.

FIG. 2 is a cross-sectional view of an individual memory cell in an exemplary embodiment.

DETAILED DESCRIPTION OF THE INVENTION

Figure 3:
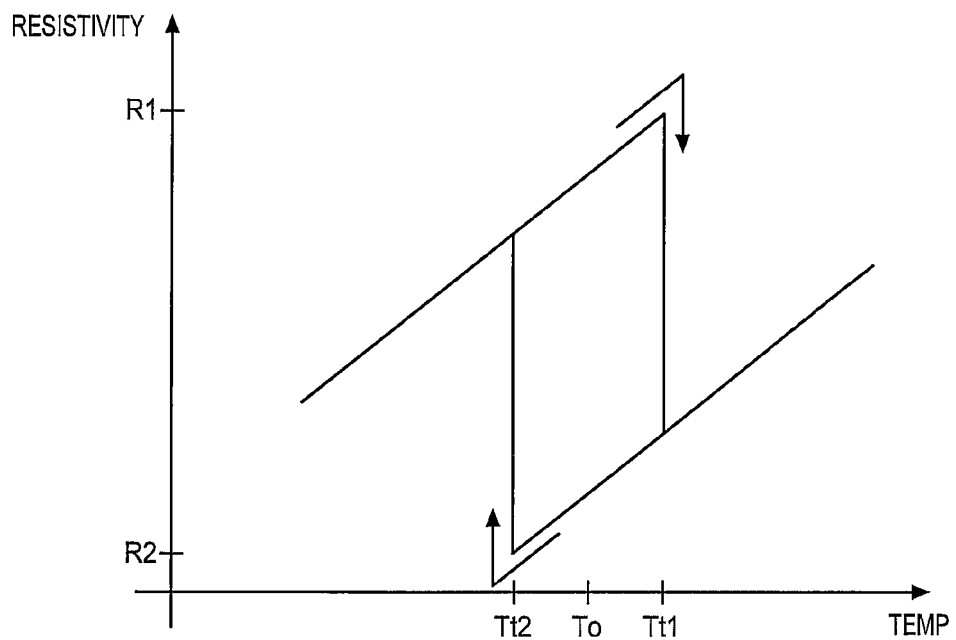
FIG. 3 is a graph illustrating resistivity versus temperature in a sharp first order phase transition between states A and B and B to A for an exemplary metallic material in an exemplary embodiment.

FIGS. 1-5 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

FIG. 1 is a schematic diagram of a cross-point memory array 100 of a solid-state memory in an exemplary embodiment of the invention. Only a portion of the cross-point memory array 100 is shown in FIG. 1. Cross-point memory array 100 includes a plurality of memory cells 102, a plurality of electrically conductive row lines that function as parallel word lines 111-114, and a plurality of electrically conductive column lines that function as parallel bit lines 121-124. Bit lines 121-124 are oriented in a different direction preferably at right angles to word lines 111-114, so that the two sets of lines cross over or intersect when viewed from above. Four word lines 111-114 and four bit lines 121-124 are illustrated in FIG. 1, but the number of lines would typically be much larger to form memory array 100.

A memory cell 102 is located in the region of intersection between a word line 111-114 and a bit line 121-124. Each memory cell 102 is electrically connected to one word line 111-114 and one bit line 121-124 in this embodiment, although other configurations may be used in other embodiments. For instance, the memory cell 102 in the center of cross-point memory array 100 is coupled to word line 113 and bit line 123. The memory cell 102 in the center of cross-point memory array 100 may thus be accessed through word line 113 and bit line 123.

FIG. 2 is a cross-sectional view of an individual memory cell 102 in an exemplary embodiment. The memory cell 102 illustrated in FIG. 2 is the memory cell 102 in the center of cross-point memory array 100 of FIG. 1. Memory cell 102 is located in the intersection region between word line 113 and bit line 123 that is vertically spaced between the lines. Memory cell 102 contacts word line 113 on its top surface in FIG. 2, and contacts bit line 123 on its bottom surface. Memory cell 102 and lines 113 and 123 are surrounded by insulating material in actual fabrication.

Memory cells 102 shown in FIGS. 1-2 are formed from a metallic material, such as FeRh, a metallic alloy including Fe and Rh, or another metallic material exhibiting a first order phase transition. In this embodiment, memory cells 102 are formed entirely from the metallic material. In other words, memory cells 102 are formed from a single layer of the metallic material. Memory cells 102 formed from the metallic material have a lower overall resistivity as compared to semiconductor material. Thus for given cell dimensions, the metallic memory cells 102 may be written to faster than cells comprising insulating or semiconductor material, which improves the overall data rate of the memory array 100. Also, being formed from a single layer of metallic material simplifies fabrication of memory 100 as multiple layers of material do not need to be deposited and formed.

In other embodiments, memory cells 102 may include a metallic material exhibiting a first order phase transition as described herein and one or more other materials or layers, but are substantially formed from the metallic material in order to provide the characteristics described below.

In FIG. 2, memory cell 102 is at a first resistance state when at an operating temperature. To write to memory cell 102, a current pulse is induced through word line 113, through the memory cell 102, and through bit line 123 (or vice versa). The current pulse raises the temperature of the memory cell 102 to a temperature at which the resistance of the memory cell 102 changes or transitions to a second resistance state. When the cell cools back down to the operating temperature, it remains in the second resistance state due to temperature hysteresis. To read from memory cell 102, a sense current is induced through word line 113, through the memory cell 102, and through bit line 123 (or vice versa). The resistance state of the memory cell 102 is detected through the sense current.

A first order phase transition is characterized by a discontinuous change of an order-parameter when external variables such as temperature or pressure are changed. For example, for FeRh the magnetic order changes from antiferromagnetic to ferromagnetic as the temperature is increased, and back to antiferromagnetic as the temperature is decreased. Due to lower electron scattering in the ferromagnetic phase, the resistivity in FeRh decreases as its phase changes from antiferromagnetic to ferromagnetic. Although in theory a first order phase transition is abrupt, it typically is somewhat broadened due to material defects such as grain boundaries, local chemical disorder, or other imperfections. Moreover, hysteresis between the two states is typically observed due to energy barriers that need to be overcome. Hysteresis in the present invention is desired since it allows for storing information in both the high and low resistivity phase at the same temperature. The hysteresis should be at least as wide as broadness of the transition to ensure that information is stored in the high temperature phase after the cell is cooled down after writing.

According to features and aspects herein, the metallic material used to form memory cells 102 has the characteristic of having a first order phase transition due to a temperature change, the first order phase transition being reflected in a change in resistivity. FIG. 3 is a graph illustrating the resistivity versus temperature for an exemplary metallic material. As the temperature being applied to the metallic material is increased to Tt1, the metallic material goes through a first order phase transition for example from antiferromagnetic to ferromagnetic state causing a change of its resistivity from a high resistivity state R1 to a low resistivity state R2. As the temperature applied to the material is decreased to Tt2, the material undergoes a first order phase transition to revert back to the high resistivity state R1. This large resistivity change over a small temperature range provides advantageous characteristics for solid-state memories. A cell from the exemplary material in FIG. 3 would be operated at To, a temperature somewhere between Tt1 and Tt2. The exemplary metallic material may be FeRh, a metallic alloy including Fe and Rh, or another metallic material. Although the first order phase transition illustrated in FIG. 3 is sharp, it generally in practice is broad as pointed out above and illustrated in FIG. 4. However, for practical reasons the broadness of the transition should preferably be about 20° C. or less. Moreover, a temperature hysteresis width W of at least the broadness B of the transition is desired to ensure that information is stored in the high temperature phase after the cell is cooled down to the operating temperature To after writing.

As stated above, an exemplary metallic material for a memory cell may be FeRh. FeRh exhibits a first order phase transition from an antiferromagnetic phase to a ferromagnetic phase as it is heated through a transition temperature. It typically exhibits the antiferromagnetic to ferromagnetic transition at about 75° C. (onset temperature of the transition), a transition broadness of about 20° C. and a temperature hysteresis width of about 40° C. The transition temperature may be tuned by doping the FeRh with another element. For instance, the transition temperature may be increased with the addition of Ir or Pt, or may be decreased with the addition of Pd or Ni. A change in resistivity of about 60% can be achieved with the transition from the antiferromagnetic phase to the ferromagnetic phase.

Figure 4:
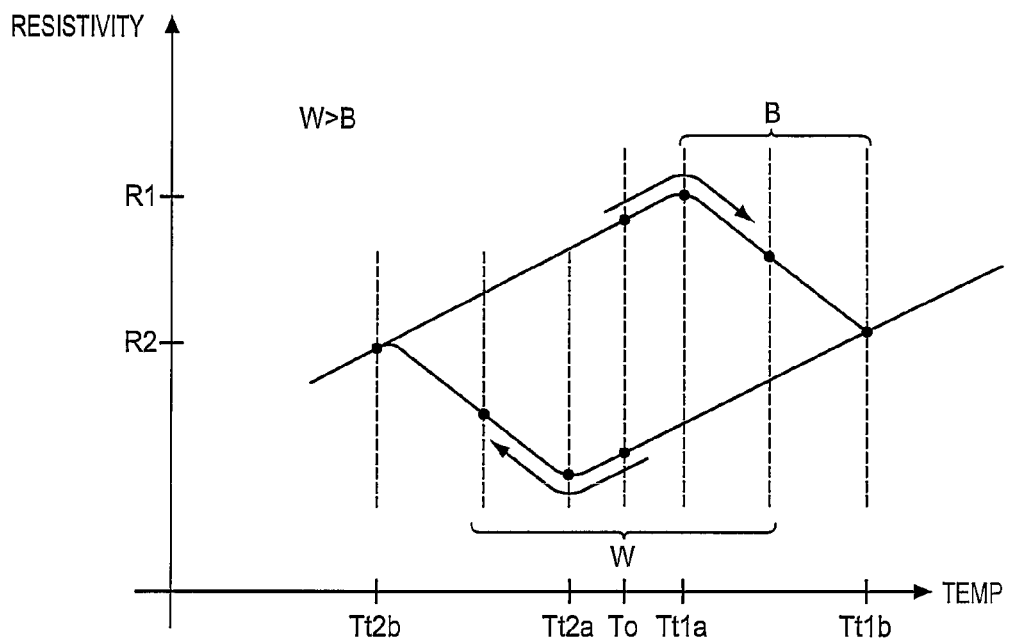
FIG. 4 is a graph illustrating resistivity versus temperature in a broadened first order phase transition between states A and B, where the width of the temperature hysteresis is larger than the broadness of the transition from A to B and B to A for an exemplary metallic material in an exemplary embodiment.

To operate a cross-point memory array 100 with FeRh memory cells, the FeRh memory cells may be prepared (with proper doping) so that they are at an operating temperature (To) at which the FeRh memory cells are in the high resistivity antiferromagnetic phase (see FIGS. 3-4). One example of the operating temperature (To) may be about 70° C. with proper doping. To write to a memory cell, a large enough current pulse is applied to the memory cell through the corresponding word line and bit line to heat the memory cell. As the memory cell is heated from the operating temperature (To) up to a higher temperature referred to herein as the upper transition temperature (Tt1$a$) the first order phase transition from the high resistivity antiferromagnetic phase to the low resistivity ferromagnetic phase occurs. The memory cell thus switches from a high resistance state R1 to a low resistance state R2. For a broad transition the upper transition temperature (Tt1$b$) denotes the temperature at which the phase transition into the high temperature phase is substantially completed. One example of the upper transition temperatures (Tt1$a$) and (Tt1$b$) may be about 90° C. and 110° C., respectively. The resistivity change due to the first order phase transition may be as large as 60% or more. For instance, for a 50 nm×50 nm×50 nm FeRh memory cell, the high resistance state may be about 24 Ohms while the low resistance state R2 may be about 16 Ohms.

When the current is removed, the memory cell again cools down to the operating temperature (To). The memory cell remains in the ferromagnetic phase due to the hysteresis characteristic of the memory cell. The memory cell may be returned to the high resistivity antiferromagnetic phase by cooling the cell below a lower transition temperature (Tt2$a$). For a broad transition the lower transition temperature (Tt2$b$) denotes the temperature at which the phase transition to the low temperature phase is substantially completed. One example of the lower transition temperatures (Tt2$a$) and (Tt2$b$) may be about 50° C. and 30° C., respectively. The cooling of individual cells may be realized by a thermoelectric element such as a Peltier elements coupled to individual cells. Alternatively, the entire array can be erased by lowering the ambient temperature below the lower transition temperature (Tt2$b$).

Figure 5A:
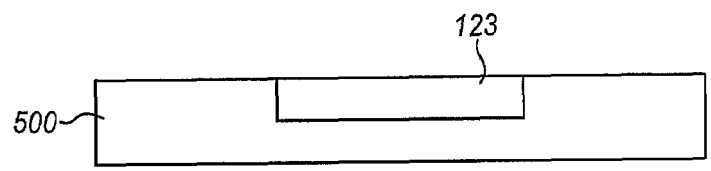
FIG. 5 illustrates a processing sequence of forming a metallic memory cell in an exemplary embodiment.

The metallic memory cell structure has a classic cross-point design and includes the fabrication of a bottom lead structure array, the active memory cell, and the top lead structure array. FIG. 5 illustrates a processing sequence of forming a metallic memory cell in an exemplary embodiment. To begin the formation of a bit line 123 in FIG. 2, an insulating undercoating layer 500, such as SiO$_2$, is deposited. The undercoating layer 500 is then etched (e.g., reactive ion etching (RIE)) or otherwise processed to form trenches having widths corresponding with the widths of the bit lines and depths corresponding with the thickness of the bit lines. A layer of bit line material, such as Cu or a similar material, is then deposited usually by electroplating to form the bit lines 123. Chemical mechanical polishing is then performed to remove the bit line material on the wafer surface except in the RIE trench region. The resultant bit lines 123 are shown in FIG. 5A.

Figure 5B:
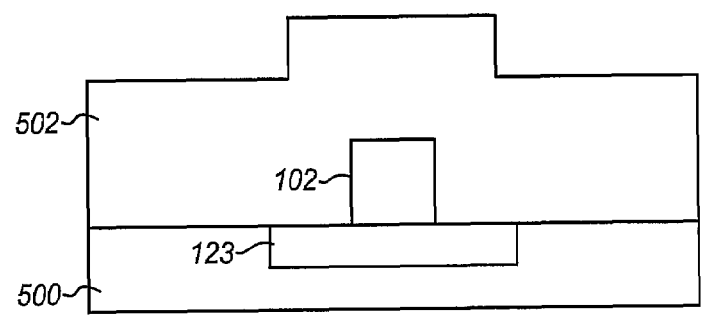

The memory cells 102 are then formed. To form the memory cells 102, memory cell material, such as FeRh, is deposited. A lithography step is then performed to define the shape of the memory cells 102. The memory cell material is then ion milled to remove the FeRh material along with the resist. An overcoating 502 of a second layer of material, such as SiO2, is then deposited. This is shown in FIG. 5B.

Figure 5C:
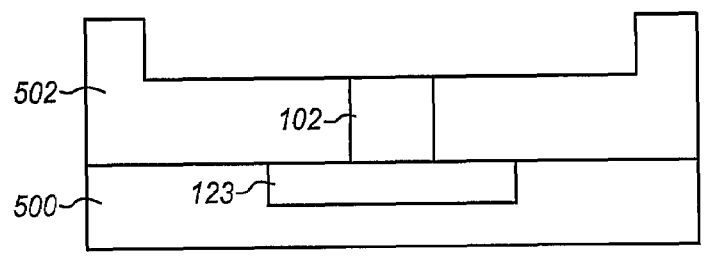
Figure 5D:
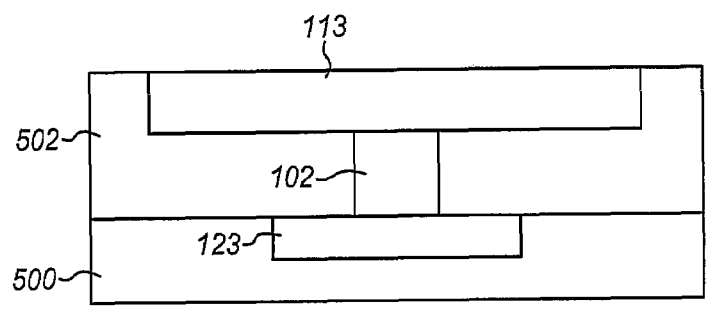

The process for forming word lines 113 includes performing chemical mechanical polishing to form a planarized surface on the overcoating layer 502. The planarized surface on the overcoating layer 502 is then etched (e.g., RIE) or otherwise processed to form trenches to depths that make contact with the top of the metallic memory cells 102. This is shown in FIG. 5C. A layer of word line material, such as Cu or similar material, is then deposited usually by electroplating to form the word lines 113. Chemical mechanical polishing is then performed to remove the Cu material on the wafer surface except in the RIE trench region. The resultant word lines 113 are shown in FIG. 5D.

Although specific embodiments were described herein, the scope of the invention is not limited to those specific embodiments. The scope of the invention is defined by the following claims and any equivalents thereof.

We claim:

1. A memory array comprising:
   a plurality of word lines;
   a plurality of bit lines; and
   a plurality of memory cells located at the intersections of the word lines and the bit lines;
   wherein the memory cells consist of a single layer of a metallic alloy, wherein the metallic alloy comprises Fe and Rh.

2. The memory array of claim 1 wherein the magnetic alloy exhibits a first order phase transition from a low temperature high resistivity state to a high temperature low resistivity state.

3. The memory array of claim 1 wherein the metallic alloy comprises FeRh.

4. The memory array of claim 1 wherein the metallic alloy further comprises one of Ir, Pt, Pd, or Ni.

5. A memory array comprising:
   a first plurality of electrically conductive lines;
   a second plurality of electrically conductive lines that cross over the first plurality of electrically conductive lines at intersection regions; and
   a plurality of memory cells located at the intersection regions between the first plurality of electrically conductive lines and the second plurality of electrically conductive lines;
   wherein the memory cells consist of a single layer of a metallic alloy, wherein the metallic alloy comprises at least Fe and Rh.

6. The memory array of claim 5 wherein a characteristic of the metallic alloy includes a first order phase transition due to a temperature change and substantially completing the transition in the range of about 20° C. or less.

7. The memory array of claim 6 wherein the first order phase transition is from a low temperature high resistivity state to a high temperature low resistivity state.

8. The memory array of claim 5 wherein the metallic alloy further includes one of Ir, Pt, Pd, or Ni.

9. A memory array comprising:
   a first plurality of electrically conductive lines;
   a second plurality of electrically conductive lines that cross over the first plurality of electrically conductive lines; and
   a plurality of memory cells between the first plurality of electrically conductive lines and the second plurality of electrically conductive lines, wherein each of the plurality of memory cells contacts one of the first plurality of electrically conductive lines and contacts one of the second plurality of electrically conductive lines;
   wherein the memory cells consist entirely of a metallic alloy, wherein the metallic alloy comprises Fe and Rh.

10. The memory array of claim 9 wherein the metallic alloy exhibits a first order phase transition due to a temperature change in the range of about 20° C. or less.

11. The memory array of claim 10 wherein the first order phase transition is from a low temperature high resistivity state to a high temperature low resistivity state occurring at a transition temperature.

12. The memory array of claim 11 wherein the transition temperature is increased by doping the metallic alloy with one of Jr or Pt.

13. The memory array of claim 11 wherein the transition temperature is decreased by doping the metallic alloy with one of Pd or Ni.

14. The memory array of claim 10 wherein the first order phase transition is from an antiferromagnetic phase to a ferromagnetic phase.

15. The memory array of claim 9 wherein the memory cell is comprised entirely of FeRh.

* * * * *